United States Patent [19]

Lim et al.

[11] Patent Number: 5,756,389

[45] Date of Patent: May 26, 1998

[54] METHOD FOR FORMING TRENCH ISOLATION FOR SEMICONDUCTOR DEVICE

[75] Inventors: Jun-Hee Lim; Yoon-Jong Huh, both of Seoul, Rep. of Korea

[73] Assignee: Goldstar Electron Company, Ltd., Cheongju, Rep. of Korea

[21] Appl. No.: 628,958

[22] Filed: Apr. 8, 1996

Related U.S. Application Data

[63] Continuation of Ser. No. 359,671, Dec. 20, 1994, abandoned.

[30] Foreign Application Priority Data

Dec. 22, 1993 [KR] Rep. of Korea ............... 1993-29028

[51] Int. Cl.$^6$ ................................................. H01L 21/76
[52] U.S. Cl. .................... 438/425; 438/427; 438/433; 438/702
[58] Field of Search ................................ 438/425, 427, 438/433, 227, 702

[56] References Cited

U.S. PATENT DOCUMENTS

| 5,308,786 | 5/1994 | Lar et al. |
| 5,374,583 | 12/1994 | Lar et al. |
| 5,393,373 | 2/1995 | Jan et al. |

FOREIGN PATENT DOCUMENTS

| 55113343 | 9/1980 | Japan |
| 59-11645 | 1/1984 | Japan |
| 59-112633 | 6/1984 | Japan |
| 59-96745 | 6/1984 | Japan |

OTHER PUBLICATIONS

Wolf, S. *Silicon Processing for the VLSI Era: vol. 2, Process Integration*, Lattice Press, 1990, pp. 56–57.

J.H.Ahn, et al.; "Micro Villus Patterning (MVP) Technology for 256Mb DRAM Stack Cell"; 1992 Symposium on VLSI Technology Digest of Technical Papers; pp. 12–13.

M. Sakao, et al.; "A Capacitor–Over–Bit–Line (COB) Cell with a Hemispherical–Grain Storage Node for 64 Mb DRAMs"; IEDM 90; pp. 655–658.

M. Yoshimaru, et al.; "Rugged Surface Poly-Si Electrode and Low Temperature Deposited $Si_3N_4$ for 64MBit and STC Beyond Dram Cell"; IEDM 90; pp. 659–662.

Hirohito Watanabe, et al.; "Device application and structure obvservation for hemispherical-grained"; J. Appl. Phys., vol. 71, No. 7, 1 Apr. 1992; pp.3538–3543.

*Primary Examiner*—George R. Fourson
*Attorney, Agent, or Firm*—Loudermilk & Associates

[57] ABSTRACT

A semiconductor device isolating method is disclosed which may include the steps of: forming a buffer layer and an insulating layer on a semiconductor substrate, and etching to remove partially the insulating layer so as to form an opening corresponding to the device isolating region; forming hemispherical polysilicon patterns on the whole surface of the substrate; removing the buffer layer exposed between the HSG-Si patterns on the bottom of the opening, and dry-etching the resultant exposed silicon regions to form a plurality of trenches and silicon poles with a certain depth and length; forming an oxide layer on the inside of the trench, and filling the interior of the trench with polysilicon; and oxidizing the polysilicon filled in the trench to form a device isolating region.

5 Claims, 4 Drawing Sheets

METHOD FOR FORMING TRENCH ISOLATION FOR SEMICONDUCTOR DEVICE

This application is a continuation of application Ser. No. 08/359,671 filed on Dec. 20, 1994, now abandoned.

FIELD OF THE INVENTION

The present invention relates to methods for isolating semiconductor devices, and more particularly to methods in which a pattern of hemispherical silicon grains is provided in the form of an archipelago, and a trench is formed by using the pattern of hemispherical silicon grains as the mask, thereby forming a device isolating region.

BACKGROUND OF THE INVENTION

Semiconductor devices are formed on a substrate and, therefore, the semiconductor devices have to be electrically isolated from each other.

The conventional method for isolating semiconductor devices is the so-called LOCOS method which is a selective oxidizing method. This method is carried out in the following manner. An oxide layer, which is called a buffer oxide layer, is formed on a silicon substrate, and a non-oxidizing silicon nitride layer is formed thereupon. The above layers are removed only from the device isolating regions. Depending on the needs, an impurity is ion-implanted into the isolating regions, and the regions are subjected to a thermal oxidation, thereby forming a field oxide layer.

In this method, however, a bird's beak is formed during the selective oxidation. That is, the oxide layer portion extends from the isolating region into the device region (active region), thereby making it unsuitable for the formation of a high density semiconductor device.

In an attempt to overcome the above described disadvantages, more advanced device isolating methods have been proposed, among them being a device isolating method using a trench. Such a method is illustrated in FIGS. 1A to 1G, and, according to this method, the intrusion of the bird's beak is reduced as illustrated in the drawings. Such methods include a dual trenched isolating process, and this method will be described in detail below.

As illustrated in FIG. 1A, oxide layer 11 and first nitride layer 12 are successively deposited on silicon substrate 10. An opening is formed on the portion where the device isolating region is to be formed by applying a photo etching method. This step defines the device forming region.

Then, polysilicon layer 13 is deposited on the whole surface, and a second nitride layer is formed. An etching is carried out applying a dry etching method and utilizing the polysilicon layer as an etch stop layer until side wall insulating layer 14 is formed on the side wall of the opening. In this state, a thermal oxidation process is carried out on the exposed polysilicon layer which has been defined as side wall insulating layer 14 of the opening, thereby forming first field oxide layer 15 as shown in FIG. 1B.

Side wall insulating layer 14 is composed of silicon nitride, and, therefore, it is removed applying a wet etching process using phosphoric acid so as to expose the side wall of the opening as shown in FIG. 1C.

A dry etching process is carried out from the opposite edges of the opening toward the silicon layer so as to form dual trenches $T_1$ and $T_2$ as illustrated in FIG. 1D. After forming the trenches, an ion implantation is carried out, and a thermal oxidation process is carried out on the side wall of the trenches until oxide layer 16 is formed.

As illustrated in FIG. 1E, the interiors of the trenches are filled with polysilicon layer 17, and a thermal oxidation is carried out so as to form a first field oxide layer together with device isolating region 18. Device isolating region 18 is formed as illustrated in FIG. 1F, and the nitride layers are removed as illustrated in FIG. 1G.

In the above described device isolating method using dual trenches, the process is complicated when the method is applied to actual devices. That is, when the side wall insulating layer is formed, the dry etching is not easy to carry out, and a controlled thermal oxidation is required during the process, which is a further complication.

Further, when forming the first field oxide layer as the side wall insulating layer, a masking operation is required, so that the substrate may be stressed. In this state, if a memory cell such as DRAM is formed on the device forming region, the device increases the standby current, and lowers the refresh characteristics, with the result that this conventional technique may have low reliability.

Further, the sizes of the device isolating regions formed on a chip is not uniform and, therefore, when the conventional method is applied, the widths of the trenches are not uniform, resulting in the thickness of the device isolating film becoming non-uniform.

SUMMARY OF THE INVENTION

The present invention is intended to overcome the above described disadvantages of the conventional techniques.

It is an object of the present invention to provide a semiconductor device isolating method in which the bird's beak is eliminated so as to be suitable for formation of a high density semiconductor device. It also is an object to provide uniform devices isolating regions of a sufficient thickness so that the process may be carried out in a reliable and easy manner.

In achieving the above object, the semiconductor isolating method according to the present invention includes the steps of: forming a buffer layer and an insulating layer on a semiconductor substrate, and carrying out an etching to remove partially the insulating layer so as to form an opening corresponding to the device isolating region; forming hemispherical polysilicon patterns (HSG-Si) (hemispherical grained silicon) on the whole surface of the substrate; removing the buffer layer exposed between the HSG-Si patterns on the bottom of the opening, and dry-etching the resultant exposed silicon regions so as to form a plurality of trenches and silicon poles with a certain depth and length; forming an oxide layer on the inside of the trench, and filling the interior of the trench with polysilicon; and oxidizing the polysilicon filled in the trench to form a device isolating region.

According to another aspect of the present invention, a process for forming a field oxide layer through a thermal oxidation is carried out directly after the formation of the trenches and poles.

As can be seen in the above description, a large number of tiny poles and trenches are formed within the device isolating region, and the poles have similar sizes regardless of the size of the device isolating region. Therefore, during the filling of the interiors of the trenches, no difference of thickness occurs, so that uniform device isolating regions may be obtained.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

Prior to forming devices on a semiconductor substrate, device isolating regions are first formed on the selective regions.

The embodiment to be described below is for showing the fact that the process of the present invention can be easily applied to forming narrow device isolating regions and wide device isolating regions.

Figure 2:
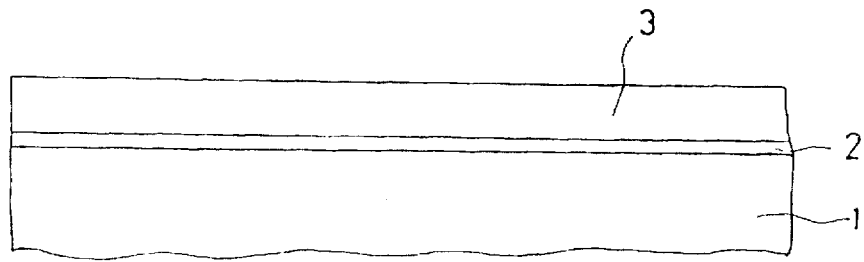
FIGS. 2A to 2G are partial sectional views of an isolating region in a semiconductor wafer illustrating the semiconductor device isolating process according to the present invention.
Figure 2:
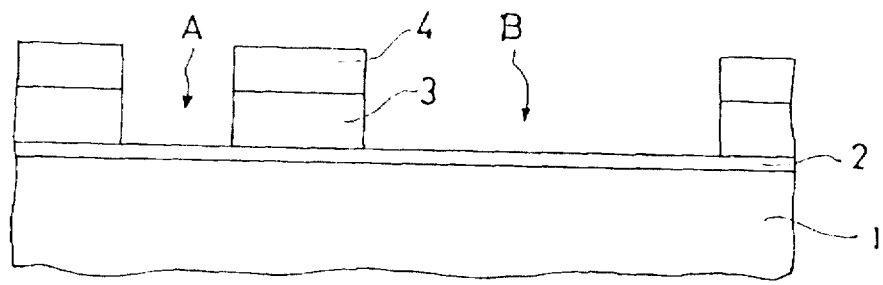
Figure 2:
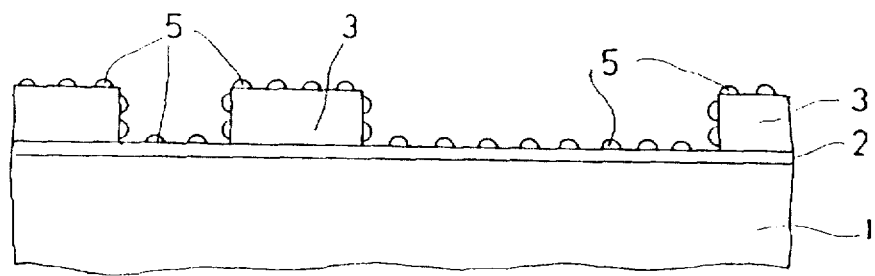
Figure 2:
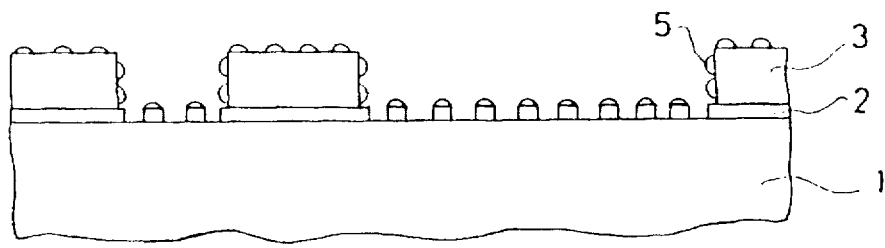
Figure 2:
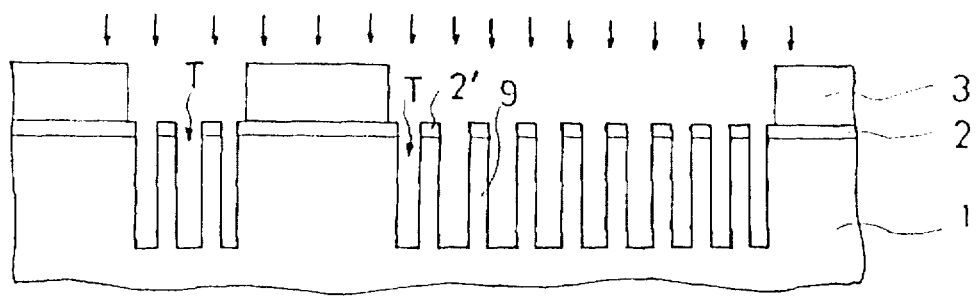
Figure 2:
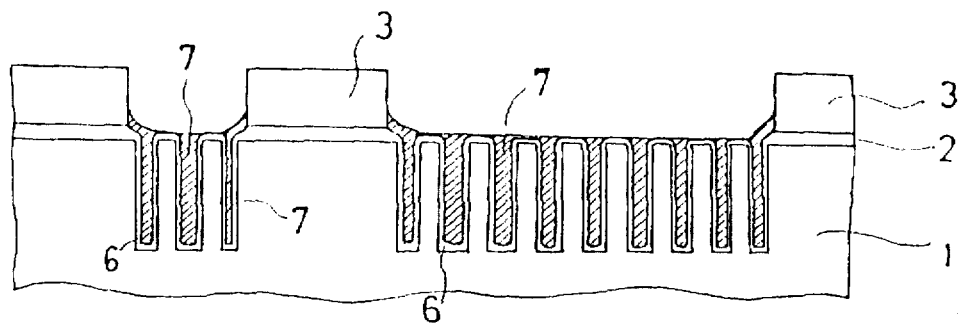
Figure 2:
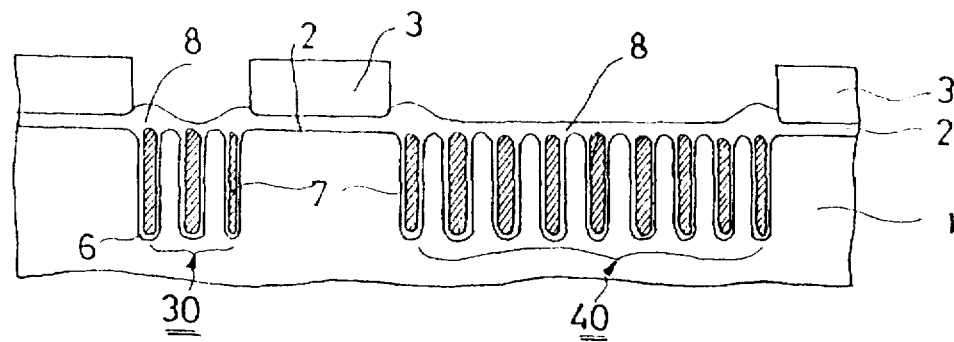

As illustrated in FIG. 2A, silicon oxide layer 2 as a buffer layer and silicon nitride layer 3 as a non-oxidized insulating layer are deposited on semiconductor substrate 1. This is for protecting the active region during the proceeding of an oxidation process, and is for defining a device isolating region.

Referring to FIG. 2B, as mentioned above, openings A and B are formed by applying a photo etching process so as to define a narrow device isolating region "A" and a wide device isolating region "B". After forming photo-resist pattern 4, silicon nitride layer 3 is etched using photo-resist mask 4, and silicon oxide layer 2 is exposed on the bottom of the openings. Photo resist pattern 4 is removed.

Thus, isolating regions "A" and "B" are defined. As illustrated in FIG. 2C, hemispherical grained polysilicon (to be called HSG-Si below) pattern 5 is formed on the whole surface of the substrate in a dispersed manner so as for pattern 5 to be separated by proper distances.

Now the formation of the HSG-Si patterns will be described below in detail.

In order to increase the effective area of the capacitor which is an essential component in a semiconductor memory, i.e., a "DRAM" of over 64M bits, the formation of an HSG-Si structure has been proposed. This structure is obtained through a partial crystallization if polysilicon is deposited applying a low pressure chemical vapor deposition method under proper conditions.

Polysilicon is deposited by decomposing pure silane (SiH$_4$) within an LPCVD reaction chamber. If an experiment is carried out with the pressure of silane to be about 0.2 Torr, and with the depositing temperature varied between about 500° and 620° C., then it can be confirmed that the polysilicon is changed from a non-crystalline structure to a polycrystalline structure. The layer which is deposited at a temperature of about 560° C. has a non-crystalline and polycrystalline region. If the depositing temperature is raised, the diameter of the grains is reduced, while the density of the grains is increased.

Figure 1:
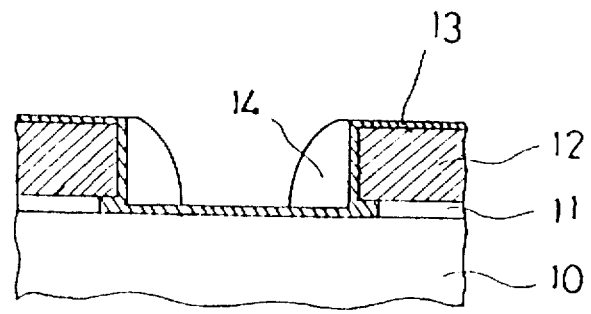
FIGS. 1A to 1G are partial sectional views of an isolating region illustrating a conventional semiconductor device isolating process.
Figure 1:
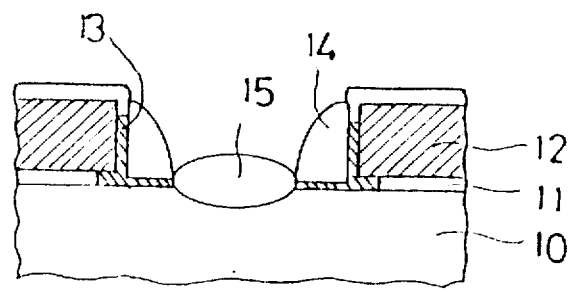
Figure 1:
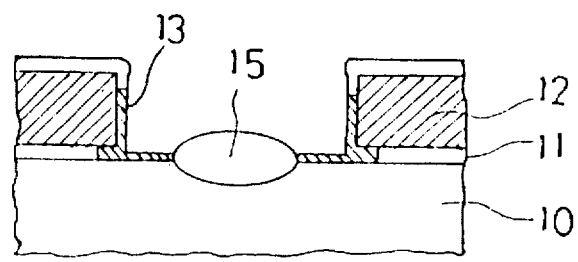
Figure 1:
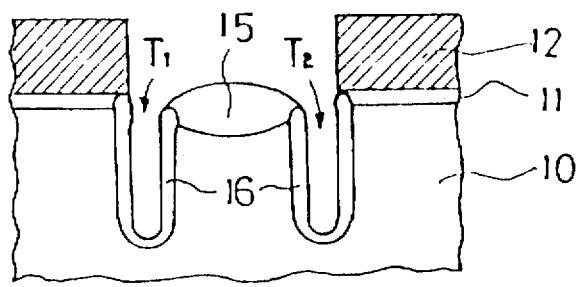
Figure 1:
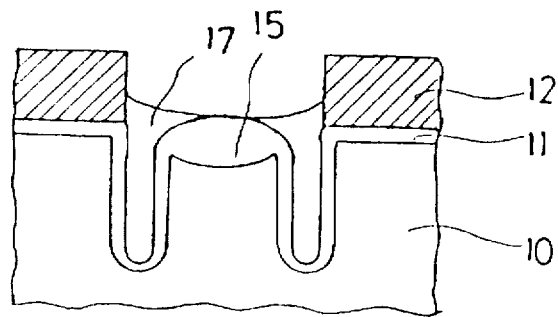
Figure 1:
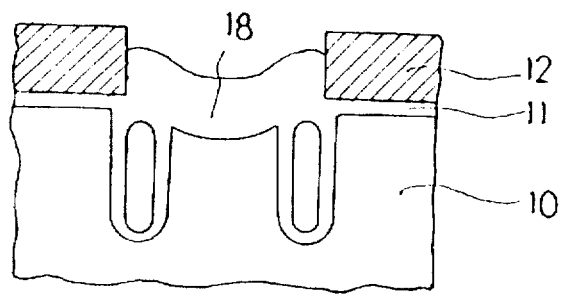
Figure 1:
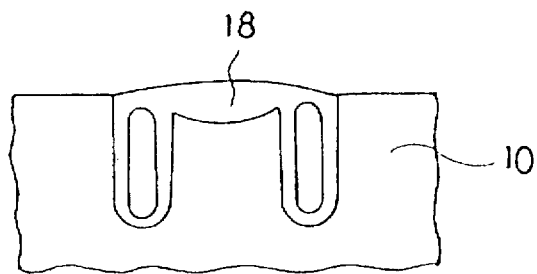
Figure 3:
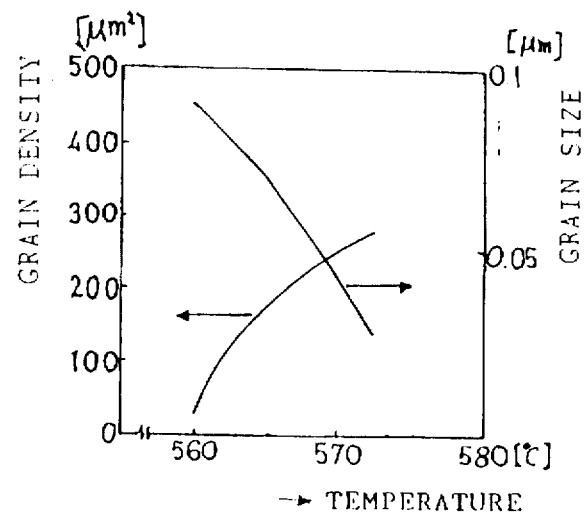
FIG. 3 is a graphical illustration of the density and size of the hemispherical silicon grains versus the deposition temperature.

The graph of FIG. 3 illustrates the grain density and the grain size versus the variation of the depositing temperature, with the layer thickness being fixed to about 0.1 μm. That is, FIG. 3 confirms in graphical form the process described above.

In the present invention, the HSG-Si patterns are distributed in the form of an "archipelago" including many islands, and trenches in the substrate are formed by using the archipelago-type patterns as mask, thereby using the patterns for isolating the devices. The distances between the islands are related to the distribution of the HSG-Si patterns and to the subsequent etching process. As its standard deviation is about ±3%, uniformity of the pattern is ensured.

After forming properly separated HSG-Si patterns 5 as shown in FIG. 2C, silicon oxide layer 2 is partly etched using HSG-Si pattern 5 as a mask so as for the substrate to be exposed as shown in FIG. 2D. Thus, the silicon layer is exposed between the HSG-Si patterns, and a dry etching is carried out to remove the Si toward the substrate as shown in FIG. 2E, with the result that a large number of tiny silicon poles 9 are formed between trenches "T". The shape and size of the poles are the same in both the narrow and wide openings.

These trenches "T" appear to be separated from each other in a sectional view, but if they are viewed in a plan view, the trenches may be said to be connected through inter-trench poles 9.

HSG-Si patterns 5 which were previously formed are removed during the etching process for removing the silicon layer. Then, silicon oxide layer 2' is exposed on poles 9 which form the trenches, and silicon oxide layer 2' is removed by an etching process. In other embodiments, this step may be skipped.

In order to prevent channel inversion, the device isolating regions preferably have a high concentration impurity layer. Therefore, at this stage, an ion implantation is carried out into the substrate.

As illustrated in FIG. 2F, a thermal oxidation layer is grown on the inner circumferential surface of the trench so as to form silicon oxide layer 6 so as to surround the substrate surface, and so as to insulate the substrate. Then, a polysilicon layer is deposited to fill the interior of the trench, and an etch back of the polysilicon layer is carried out, and the interior of the trench is filled with polysilicon layer 7.

Polysilicon layer 7 is oxidized to form silicon oxide layer 8 as illustrated in FIG. 2G, thereby completing the formation of the device isolating regions, including narrow device isolating region 30 and wide device isolating region 40. Nitride layer 3 is removed using phosphoric acid so that an active region is formed, and a semiconductor device may be formed on the active region.

The above steps are the constitution of a process of the present invention. Meanwhile, a modified embodiment can be formed from the above described embodiment, and this will be described below. That is, after formation of the trench and poles, the silicon substrate is exposed, and, therefore, in this state, a thermal oxidation is directly carried out so as to form a device isolating region.

The complete process flow for the above method is as follows. A silicon oxide layer and silicon nitride layer are formed on a semiconductor substrate, and the silicon nitride layer is removed partly, so that an opening corresponding to the device isolating region can be formed. Then, hemispherical polysilicon (HSG-Si) patterns are formed on the whole surface of the substrate, and the portions of the silicon oxide layer which are exposed between the HSG-Si patterns and on the bottoms of the openings are removed. Then a dry etching is carried out on the exposed silicon regions, so that a plurality of trenches should be formed down to a certain depth. The exposed silicon which lies within the trenches is subjected to a thermal oxidation so as to form a field oxide layer, thereby completing the modified embodiment.

When the device isolating regions typically are formed on the whole surface of the semiconductor chip, there come to exist narrow width patterns and wide width patterns together. In the case where the trenches are separated, when the narrow and wide regions are uniformly etched or buried (filled), there are accompanied difficulties. For example, the narrow trenches are quickly filled, while the wide trenches are slowly filled. Consequently, differences in thickness may arise.

According to the present invention, however, the above difficulties are overcome by forming narrow trenches even in the wide region.

According to the present invention as described above, the process steps are not complicated compared with those of the conventional process. Further, the present invention skips the dry etching of the silicon nitride layer, and the controlled thermal oxidation during the process, so that the process may be more easily carried out.

According to the present invention, an isolation of the same level is rendered possible regardless of whether the isolating region is narrow or wide.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for forming a device isolating region on a semiconductor substrate, comprising the steps of:

forming a silicon oxide buffer layer on the semiconductor substrate and a silicon nitride layer on the silicon oxide buffer layer, and partially removing the silicon nitride layer so as to form at least one opening corresponding to a device isolating region;

forming hemispherical polysilicon patterns on the resulting structure;

removing the silicon oxide buffer layer exposed between the hemispherical polysilicon patterns on the bottom of the opening, and dry etching the resultant exposed silicon regions so as to form a plurality of silicon poles and trenches;

forming an insulating layer on the silicon poles and trenches, and forming polysilicon on the insulating layer, wherein the polysilicon fills the interior of the trenches; and oxidizing a portion of the polysilicon filled in the trench to form a device isolating region.

2. The method of claim 1, wherein a channel stop ion implantation is carried out after formation of the trenches and poles.

3. The method of claim 1, wherein the hemispherical polysilicon patterns in the openings are formed by decomposition of silane.

4. The method of claim 1, wherein forming the at least one opening comprises forming device isolating regions of different widths.

5. The method of claim 1, wherein the insulating layer within the trenches comprises a thermally grown silicon oxide layer.

* * * * *